(12) United States Patent
Lee et al.

(10) Patent No.: US 10,438,635 B2
(45) Date of Patent: Oct. 8, 2019

(54) APPARATUS AND METHOD OF TRANSMITTING AND RECEIVING DATA, AND SEMICONDUCTOR PACKAGE INCLUDING THE SAME

(71) Applicant: Samsung Electronics Co., Ltd., Suwon-si, Gyeonggi-do (KR)

(72) Inventors: Seon-Kyoo Lee, Hwaseong-si (KR); Dae-Hoon Na, Seoul (KR); Jeong-Don Ihm, Seongnam-si (KR); Byung-Hoon Jeong, Hwaseong-si (KR); Young-Don Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/113,500

(22) Filed: Aug. 27, 2018

(65) Prior Publication Data
US 2019/0198067 A1    Jun. 27, 2019

(30) Foreign Application Priority Data
Dec. 22, 2017    (KR) .................. 10-2017-0178497

(51) Int. Cl.
| | | |
|---|---|---|
| *G11C 7/10* | (2006.01) | |
| *G11C 7/06* | (2006.01) | |
| *H01L 25/065* | (2006.01) | |
| *G11C 7/22* | (2006.01) | |
| *H01L 23/00* | (2006.01) | |

(52) U.S. Cl.
CPC .............. *G11C 7/1051* (2013.01); *G11C 7/06* (2013.01); *G11C 7/1048* (2013.01); *G11C 7/1078* (2013.01); *G11C 7/222* (2013.01);
*H01L 25/0655* (2013.01); *H01L 25/0657* (2013.01); *H01L 24/48* (2013.01); *H01L 2224/48091* (2013.01); *H01L 2224/48106* (2013.01); *H01L 2224/48225* (2013.01); *H01L 2225/06513* (2013.01); *H01L 2225/06541* (2013.01);
(Continued)

(58) Field of Classification Search
None
See application file for complete search history.

(56) References Cited

U.S. PATENT DOCUMENTS

| | | |
|---|---|---|
| 7,555,048 B1 | 6/2009 | Massoumi et al. |
| 7,969,193 B1 | 6/2011 | Wu et al. |

(Continued)

*Primary Examiner* — Tan T. Nguyen
(74) *Attorney, Agent, or Firm* — Harness, Dickey & Pierce, P.L.C.

(57) ABSTRACT

An apparatus includes data transmitter having first through N-th data drivers configured to provide first through N-th data signals, respectively, and a strobe driver configured to provide a strobe signal, and a data receiver having a strobe buffer configured to generate a control signal based on the strobe signal, and first through N-th sense amplifiers configured to sense N-bit data based on the control signal, a reference signal and the first through N-th data signals. The bus includes a strobe TSV configured to connect the strobe driver with the strobe buffer, and first through N-th data TSVs configured to connect the first through N-th data drivers with the first through N-th sense amplifiers, respectively. A reference signal supplier controls the reference signal such that a discharge speed of the reference signal is slower than a discharge speed of each of the first through N-th data signals during data transmission.

20 Claims, 11 Drawing Sheets

(52) U.S. Cl.
CPC ............... *H01L 2225/06565* (2013.01); *H01L 2225/06586* (2013.01)

(56) References Cited

U.S. PATENT DOCUMENTS

| | | |
|---|---|---|
| 8,565,029 B1 | 10/2013 | Stephens, Jr. |
| 8,902,956 B2 | 12/2014 | Thomas et al. |
| 9,343,117 B1 | 5/2016 | Lee |
| 9,565,039 B2 | 2/2017 | Best et al. |
| 9,628,090 B2 | 4/2017 | Yoshimi |
| 2010/0067314 A1* | 3/2010 | Ware .................. G06F 13/1689 365/189.15 |
| 2013/0249612 A1* | 9/2013 | Zerbe .................... H04L 7/0079 327/161 |
| 2017/0162252 A1 | 6/2017 | Ware et al. |

* cited by examiner

APPARATUS AND METHOD OF TRANSMITTING AND RECEIVING DATA, AND SEMICONDUCTOR PACKAGE INCLUDING THE SAME

CROSS-REFERENCE TO RELATED APPLICATION

This application claims priority under 35 USC § 119 to Korean Patent Application No. 10-2017-0178497, filed on Dec. 22, 2017 in the Korean Intellectual Property Office (KIPO), the contents of which are herein incorporated by reference in their entirety.

BACKGROUND

1. Technical Field

Example embodiments relate generally to semiconductor integrated circuits. For example, at least some example embodiments relate to apparatuses and/or methods of transmitting and receiving data, and/or semiconductor packages including the apparatuses.

2. Description of the Related Art

Semiconductor devices transmit and receive data signals to and from external devices such as a controller and other semiconductor devices in a semiconductor system. When receiving the data signals, the semiconductor devices may determine whether the received data signals have logic high levels or logic low levels. Thus, the semiconductor devices may include a data transmitter (or a data transmitting device) that transmits data signals, and a data receiver (or a data receiving device) that receives data signals and determines whether the received data signals have the logic high levels or the logic low levels.

SUMMARY

At least one example embodiment of the present disclosure provides an apparatus of transmitting and receiving data capable of having relatively small size, high speed and low power consumption.

At least one example embodiment of the present disclosure provides a method of transmitting and receiving data capable of having relatively small size, high speed and low power consumption.

At least one example embodiment of the present disclosure provides a semiconductor package including the apparatus.

At least some example embodiments relate to an apparatus configured to transmit and receive data. In some example embodiments, the apparatus includes a data transmitter including first through N-th data drivers and a strobe driver, the first through N-th data drivers configured to generate first through N-th data signals, respectively, and the strobe driver configured to generate a strobe signal, N being a natural number; a data receiver including first through N-th sense amplifiers and a strobe buffer, the strobe buffer configured to generate a control signal based on the strobe signal, and the first through N-th sense amplifiers configured to sense N-bit data based on the control signal, a reference signal and the first through N-th data signals; a bus including a strobe through silicon via (TSV) and first through N-th data TSVs, the strobe TSV configured to connect the strobe driver with the strobe buffer, and the first through N-th data TSVs configured to connect the first through N-th data drivers with the first through N-th sense amplifiers, respectively; and a reference signal supplier configured to adjust the reference signal such that a discharge speed of the reference signal is slower than a discharge speed of each of the first through N-th data signals during data transmission.

At least some example embodiments relate to a method of transmitting and receiving data. In some example embodiments, the method includes precharging first through N-th data transmission lines and a reference node to a precharge level during a precharge interval occurring before first through N-th data signals are transmitted, the first through N-th data transmission lines configured to transmit the first through N-th data signals, the reference node configured to receive a reference signal, N being a natural number; maintaining each of the first through N-th data transmission lines to the precharge level or discharging same at a first discharge speed according to a logic level transmitted during a developing interval occurring transmission of the first through N-th data signals begins; discharging the reference node at a second discharge speed during the developing interval, the second discharge speed being slower than the first discharge speed; and sensing logic levels of each bit of N-bit data based on level differences between the first through N-th data transmission lines and the reference node during a sensing interval occurring after the transmission of the first through N-th data signals is completed.

At least some example embodiments relate to a semiconductor package. In some example embodiments, the semiconductor package includes a substrate; a first semiconductor chip on the substrate, the first semiconductor chip including a data transmitter, the data transmitter including first through N-th data drivers and a strobe driver, the first through N-th data drivers configured to provide first through N-th data signals, respectively, where N is a natural number, and the strobe driver configured to provide a strobe signal; a second semiconductor chip on the substrate, the second semiconductor chip including a data receiver, the data receiver including first through N-th sense amplifiers and a strobe buffer, the strobe buffer configured to generate a control signal based on the strobe signal, and the first through N-th sense amplifiers configured to sense N-bit data based on the control signal, a reference signal and the first through N-th data signals; a bus between the first semiconductor chip and the second semiconductor chip, the bus including a strobe transmission line configured to connect the strobe driver with the strobe buffer; and first through N-th data transmission lines configured to connect the first through N-th data drivers with the first through N-th sense amplifiers, respectively; and a reference signal supplier configured to adjust the reference signal such that a discharge speed of the reference signal is slower than a discharge speed of each of the first through N-th data signals during data transmission.

In the apparatus and method of transmitting and receiving data, and the semiconductor package according to example embodiments, the data signals may be transmitted based on a single-ended scheme, and thus the number of data transmission lines may be reduced and the apparatus may be manufactured with relatively small size and low cost. In addition, the reference signal and/or the reference node for providing the reference signal may be discharged with a discharge speed slower than those of the data transmission lines, and thus all of the data signals may be efficiently sensed or detected based on only a single reference signal.

Further, the data transmission lines and the data signals may not fully swing between the power supply voltage and the ground voltage, but may swing within relatively small range according to the logic level to be transmitted. Accordingly, the apparatus may efficiently perform the data transmission with relatively high speed and low power consumption.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
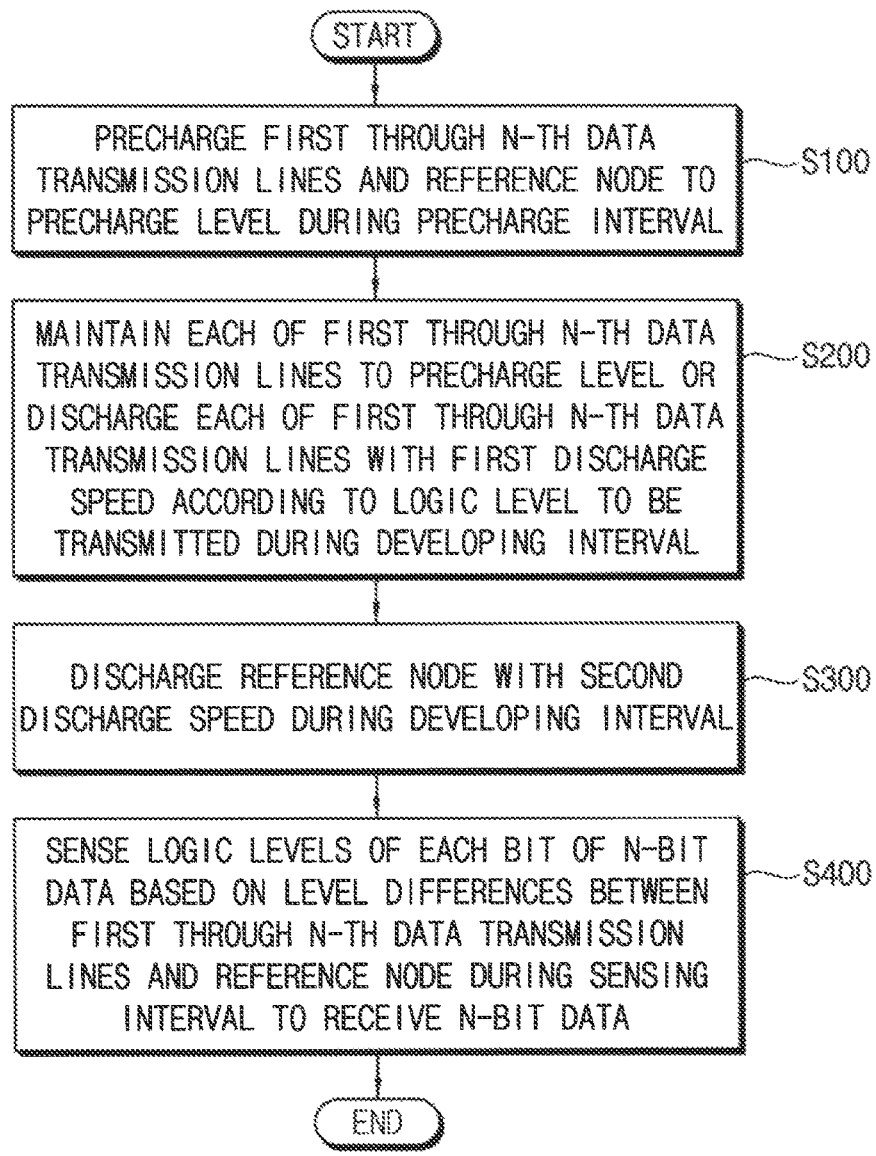
FIG. 1 is a flow chart illustrating a method of transmitting and receiving data according to example embodiments.

Various example embodiments will be described more fully with reference to the accompanying drawings, in which some example embodiments are shown. The example embodiments may, however, be embodied in many different forms and should not be construed as limited to the example embodiments set forth herein. Like reference numerals refer to like elements throughout this application.

FIG. 1 is a flow chart illustrating a method of transmitting and receiving data according to example embodiments.

Referring to FIG. 1, in a method of transmitting and receiving data according to example embodiments, before first through N-th data signals are transmitted, in operation S100, first through N-th data transmission lines and a reference node are precharged to the same voltage level during a precharge interval, where N is a natural number.

The first through N-th data transmission lines are configured to provide the first through N-th data signals, respectively, and the reference node is configured to provide a reference signal. For example, the first through N-th data transmission lines and the reference node are precharged to the same level (e.g., a precharge level) based on a precharge control signal. A precharge operation will be described with reference to FIGS. 3, 4 and 5.

In operation S200, when transmission of the first through N-th data signals begins, each of the first through N-th data transmission lines is maintained to the precharge level or discharged with a first discharge speed according to a logic level to be transmitted during a developing interval.

In addition, in operation S300, when the transmission of the first through N-th data signals begins, the reference node is discharged with a second discharge speed that is slower than the first discharge speed during the developing interval.

In some example embodiments, as will be described with reference to FIGS. 2 through 5, the reference node may be discharged with the second discharge speed by a reference driver. A drivability (or driving capacity) of the reference driver may be lower than a drivability of each of first through N-th data drivers that are configured to provide the first through N-th data signals. In other example embodiments, as will be described with reference to FIGS. 6 and 7, the reference node may be discharged with the second discharge speed by a reference signal generator that includes a first capacitor and a first resistor.

After the transmission of the first through N-th data signals is completed, in operation S400, logic levels of each bit of N-bit data are sensed based on level differences between the first through N-th data transmission lines and the reference node during a sensing interval to receive the N-bit data.

In the method according to example embodiments, the first through N-th data signals are transmitted based on a single-ended scheme, not based on a differential scheme. In the differential scheme, two data transmission lines may be utilized for transmitting a single data signal. However, in the single-ended scheme, a single data transmission line may be utilized for transmitting a single data signal. For example, the first data signal may be transmitted through the first transmission line, and the N-th data signal may be transmitted through the N-th data transmission line.

In addition, in the method according to example embodiments, a single reference signal may be used for sensing the first through N-th data signals that are transmitted based on the single-ended scheme, and the reference signal and/or the reference node for providing the reference signal is discharged with a discharge speed slower than those of the first through N-th data transmission lines. Thus, all of the first through N-th data signals may be efficiently sensed or detected based on only a single reference signal. Detailed operations and configurations according to example embodiments will be described with reference to FIGS. 2 through 7.

Figure 2:
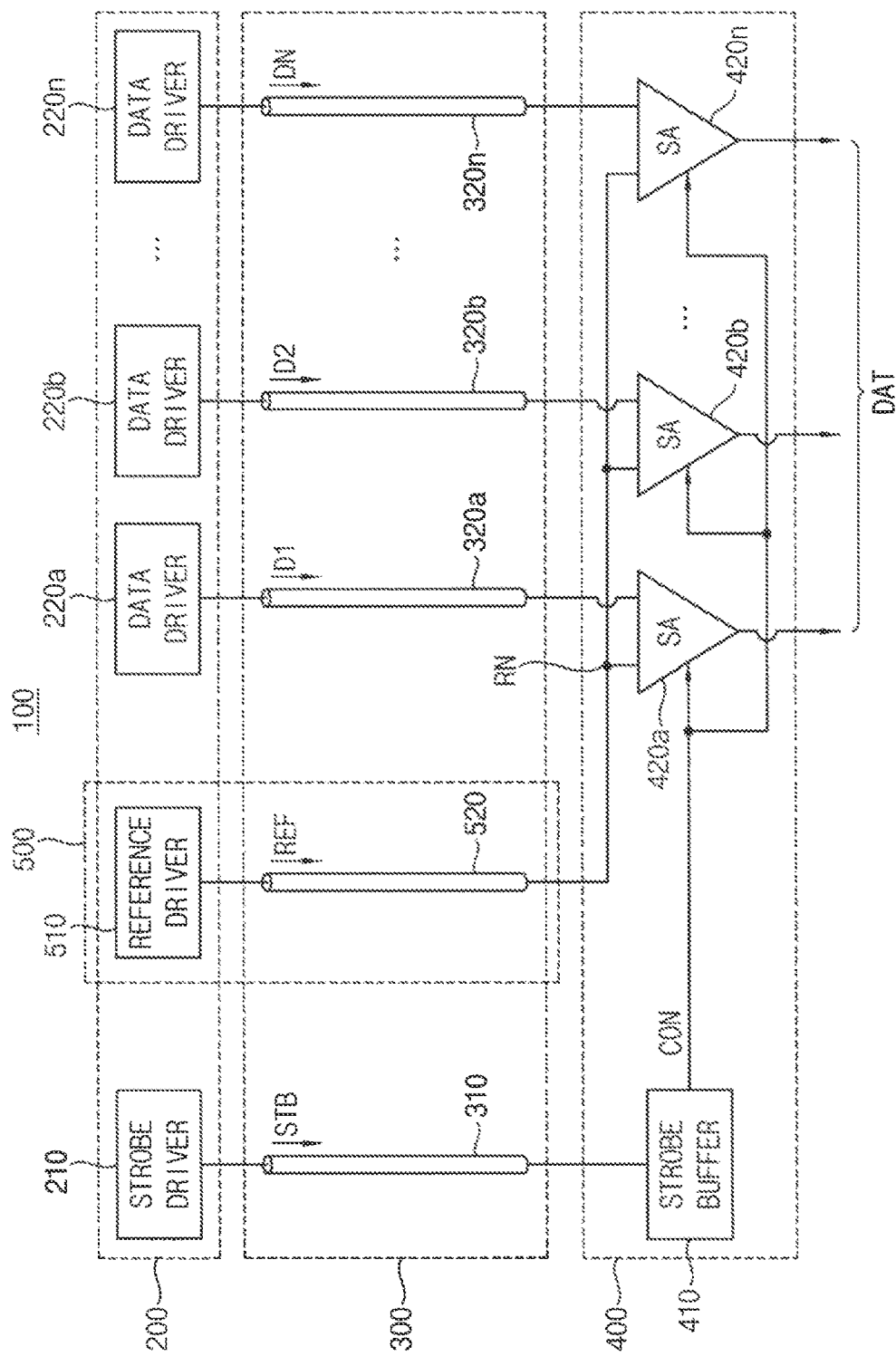
FIG. 2 is a block diagram illustrating an apparatus of transmitting and receiving data according to example embodiments.

FIG. 2 is a block diagram illustrating an apparatus of transmitting and receiving data according to example embodiments.

Referring to FIG. 2, an apparatus 100 of transmitting and receiving data includes a data transmitter 200, a bus 300, a data receiver 400 and a reference signal supplier 500.

The data transmitter 200 includes a strobe driver 210 and first through N-th data drivers 220a, 220b, ..., 220n, where N is a natural number.

The first through N-th data drivers 220a, 220b, ..., 220n are configured to provide first through N-th data signals D1, D2, ..., DN, respectively. For example, the first data driver 220a may output the first data signal D1. Similarly, the second data driver 220b may output the second data signal D2, and the N-th data driver 220n may output the N-th data signal DN. The first through N-th data signals D1, D2, ..., DN may form N-bit data DAT.

Although not illustrated in FIG. 2, the first through N-th data signals D1, D2, ..., DN may be provided from a memory device and/or a data processing device, and thus the first through N-th data drivers 220a, 220b, ..., 220n may be connected to the memory device and/or the data processing device.

The strobe driver 210 is configured to provide a strobe signal STB. The strobe signal STB may be transmitted to the data receiver 400 and may be used for triggering reception (or sense) of the first through N-th data signals D1, D2, . . . , DN. For example, the strobe signal STB may be a clock signal having a desired (or, alternatively, a predetermined) frequency.

The data receiver 400 includes a strobe buffer 410 and first through N-th sense amplifiers (SAs) 420a, 420b, . . . , 420n.

The strobe buffer 410 generates a control signal CON based on the strobe signal STB. For example, the control signal CON may include a precharge control signal (e.g., a precharge control signal PCON in FIG. 4) and a sensing control signal (e.g., a sensing control signal SCON in FIG. 4). The control signal CON may further include a developing control signal (e.g., a developing control signal DCON in FIG. 7). An operation timing of the first through N-th sense amplifiers 420a, 420b, . . . , 420n may be controlled or adjusted based on the control signal CON.

The first through N-th sense amplifiers 420a, 420b, . . . , 420n sense the N-bit data DAT based on the control signal CON, a reference signal REF and the first through N-th data signals D1, D2, . . . , DN. For example, the first sense amplifier 420a may detect a level difference between the reference signal REF and the first data signal D1 based on the control signal CON to sense or receive a first bit of the N-bit data DAT. Similarly, the second sense amplifier 420b may detect a level difference between the reference signal REF and the second data signal D2 based on the control signal CON to sense or receive a second bit of the N-bit data DAT, and the N-th sense amplifier 420n may detect a level difference between the reference signal REF and the N-th data signal DN based on the control signal CON to sense or receive an N-th bit of the N-bit data DAT.

The bus 300 includes a strobe transmission line 310 and first through N-th data transmission lines 320a, 320b, . . . , 320n. The bus 300 may be referred to as a channel.

The strobe transmission line 310 is configured to connect the strobe driver 210 with the strobe buffer 410. The strobe signal STB may be transmitted from the strobe driver 210 to the strobe buffer 410 via the strobe transmission line 310.

The first through N-th data transmission lines 320a, 320b, . . . , 320n are configured to connect the first through N-th data drivers 220a, 220b, . . . , 220n with the first through N-th sense amplifiers 420a, 420b, . . . , 420n, respectively. Each of the first through N-th sense amplifiers 420a, 420b, . . . , 420n may include a first input terminal that is connected to a respective one of the first through N-th data transmission lines 320a, 320b, . . . , 320n. Each of the first through N-th data signals D1, D2, . . . , DN may be transmitted from a respective one of the first through N-th data drivers 220a, 220b, . . . , 220n to a respective one of the first through N-th sense amplifiers 420a, 420b, . . . , 420n via a respective one of the first through N-th data transmission lines 320a, 320b, . . . , 320n.

For example, the first data transmission line 320a may connect the first data driver 220a with the first sense amplifier 420a, and the first data signal D1 may be transmitted from the first data driver 220a to the first sense amplifier 420a via the first data transmission line 320a. Similarly, the second data transmission line 320b may connect the second data driver 220b with the second sense amplifier 420b, and the second data signal D2 may be transmitted from the second data driver 220b to the second sense amplifier 420b via the second data transmission line 320b. The N-th data transmission line 320n may connect the N-th data driver 220n with the N-th sense amplifier 420n, and the N-th data signal DN may be transmitted from the N-th data driver 220n to the N-th sense amplifier 420n via the N-th data transmission line 320n.

The reference signal supplier 500 is configured to provide the reference signal REF. The reference signal supplier 500 controls or adjusts the reference signal REF such that a discharge speed of the reference signal REF is slower than a discharge speed of each of the first through N-th data signals D1, D2, . . . , DN during data transmission. A relationship or difference between the discharge speed of each of the first through N-th data signals D1, D2, . . . , DN and the discharge speed of the reference signal REF will be described with reference to FIG. 3.

In some example embodiments, the reference signal supplier 500 may include a reference driver 510 and a reference transmission line 520.

The reference driver 510 may be included or located in the data transmitter 200. A drivability of the reference driver 510 may be lower than a drivability of each of the first through N-th data drivers 220a, 220b, . . . , 220n. The reference transmission line 520 may be included or located in the bus 300 and may be connected to a reference node RN. The reference transmission line 520 may be configured to connect the reference driver 510 with the first through N-th sense amplifiers 220a, 220b, . . . , 220n. Each of the first through N-th sense amplifiers 420a, 420b, . . . , 420n may include a second input terminal that is connected to the reference transmission line 520 via the reference node RN.

In some example embodiments, a drivability of each driver (e.g., each of the first through N-th data drivers 220a, 220b, . . . , 220n and the reference driver 510) may be determined based on a resistance of each driver and a capacitance of each transmission line connected to each driver. A resistance of the reference driver 510 and/or a capacitance of the reference transmission line 520 may be determined such that the drivability of the reference driver 510 is lower than the drivability of each of the first through N-th data drivers 220a, 220b, . . . , 220n (or such that the discharge speed of the reference signal REF is slower than the discharge speed of each of the first through N-th data signals D1, D2, . . . , DN).

For example, the first through N-th data drivers 220a, 220b, . . . , 220n and the reference driver 510 may be implemented with the same structure, and each of the first through N-th data drivers 220a, 220b, . . . , 220n and the reference driver 510 may include at least one transistor. In this example, a size of a transistor that is included in the reference driver 510 may be different from a size of a transistor that is included in the first through N-th data drivers 220a, 220b, . . . , 220n such that the drivability of the reference driver 510 is lower than the drivability of each of the first through N-th data drivers 220a, 220b, . . . , 220n. Generally, a time constant increases and a discharge speed decreases as a resistance increases, and thus the size of the transistor in the reference driver 510 may be modified such that the reference driver 510 has relatively large (or heavy) resistance.

For another example, a length and/or a width of the reference transmission line 520 that transmits the reference signal REF may be different from a length and/or a width of each of the first through N-th data transmission lines 320a, 320b, . . . , 320n that transmit the first through N-th data signals D1, D2, . . . , DN such that the discharge speed of the reference signal REF is slower than the discharge speed of each of the first through N-th data signals D1, D2, . . . , DN. Generally, a time constant increases and a discharge speed decreases as a capacitance increases, and thus the length and/or a width of the reference transmission line 520 may be modified such that the reference transmission line 520 has relatively large (or heavy) capacitance.

For still another example, both the size of the transistor in the reference driver 510 and the length and/or the width of the reference transmission line 520 may be modified such that the discharge speed of the reference signal REF is slower than the discharge speed of each of the first through N-th data signals D1, D2, . . . , DN.

As will be described with reference to FIGS. 8 through 11, the data transmitter 200 and the data receiver 400 may be included in different semiconductor chips or different semiconductor devices. A configuration of the bus 300 may be changed according to an arrangement of a first semiconductor chip including the data transmitter 200 and a second semiconductor chip including the data receiver 400.

In some example embodiments, as will be described with reference to FIGS. 8 and 9, the first semiconductor chip including the data transmitter 200 and the second semiconductor chip including the data receiver 400 may be stacked on one another. In this example, the strobe transmission line 310 may include a strobe through silicon via (TSV) that is formed by penetrating at least one of a first semiconductor substrate on which the first semiconductor chip is formed and a second semiconductor substrate on which the second semiconductor chip is formed. The first through N-th data transmission lines 320a, 320b, . . . , 320n may include first through N-th data TSVs that are formed by penetrating at least one of the first semiconductor substrate and the second semiconductor substrate. The reference transmission line 520 may include a reference TSV that is formed by penetrating at least one of the first semiconductor substrate and the second semiconductor substrate.

In other example embodiments, as will be described with reference to FIGS. 10 and 11, the first semiconductor chip including the data transmitter 200 and the second semiconductor chip including the data receiver 400 may be disposed on the same plane. In this example, each of the strobe transmission line 310, the first through N-th data transmission lines 320a, 320b, . . . , 320n and the reference transmission line 520 may include at least one wire such as metal wire.

Figure 3:
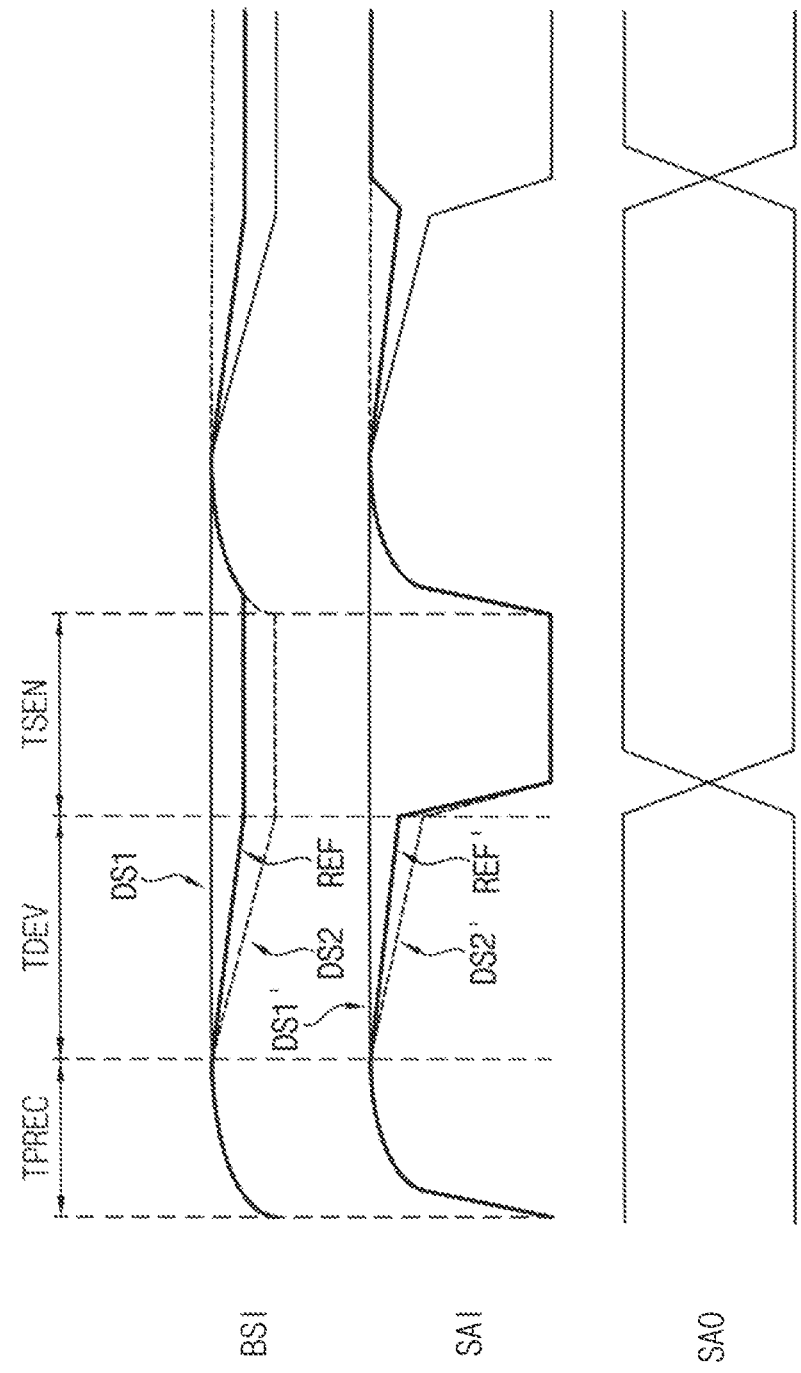
FIG. 3 is a timing diagram for describing data transmission by the apparatus according to example embodiments.

FIG. 3 is a timing diagram for describing data transmission by the apparatus according to example embodiments. In FIG. 3, "BSI" represents a change of a signal level at the transmission lines in the bus 300, "SAT" represents a change of a signal level at the sense amplifiers included in the data receiver 400, and "SAO" represents a change of a signal level at output terminals of the data receiver 400 (e.g., output terminals of the sense amplifiers). For convenience of explanation, the data transmission by the apparatus according to example embodiments will be described based on the first data transmission line 320a, the reference transmission line 520 and the first sense amplifier 420a.

Referring to FIGS. 2 and 3, while the data transmission is performed, curves that represent the change of the signal level at the transmission lines in the bus 300 (e.g., "BSI") will be described first.

Before the first through N-th data signals D1, D2, . . . , DN are transmitted, the first through N-th data transmission lines 320a, 320b, . . . , 320n and the reference transmission line 520 are precharged to the same level (e.g., the precharge level) during a precharge interval TPREC.

For example, during the precharge interval TPREC, the first data TSV that is included in the first data transmission line 320a and the reference TSV that is included in the reference transmission line 520 may be precharged, and thus the first data signal D1 and the reference signal REF may have the precharge level.

When the transmission of the first through N-th data signals D1, D2, . . . , DN begins, each of the first through N-th data transmission lines 320a, 320b, . . . , 320n is maintained to the precharge level or discharged with the first discharge speed according to the logic level to be transmitted during a developing interval TDEV subsequent to the precharge interval TPREC. In addition, when the transmission of the first through N-th data signals D1, D2, . . . , DN begins, the reference transmission line 520 is discharged with the second discharge speed that is slower than the first discharge speed during the developing interval TDEV.

For example, during the developing interval TDEV, the first data TSV that is included in the first data transmission line 320a may be maintained to the precharge level when the first data signal D1 has a first logic level DS1, as illustrated by a thin solid line in FIG. 3. During the developing interval TDEV, the first data TSV that is included in the first data transmission line 320a may be discharged with the first discharge speed when the first data signal D1 has a second logic level DS2, as illustrated by a dotted line in FIG. 3. The second logic level DS2 may be different from the first logic level DS1. For example, the first logic level DS1 may be a logic high level (e.g., "1"), and the second logic level DS2 may be a logic low level (e.g., "0"). During the developing interval TDEV, the reference TSV that is included in the reference transmission line 520 and transmits the reference signal REF may be always discharged with the second discharge speed, as illustrated by a bold solid line in FIG. 3.

An operation of discharging the first data TSV with the first discharge speed may represent that the first data TSV (or the first data signal D1) has a first level at an end time of the developing interval TDEV (e.g., at a start time of a sensing interval TSEN subsequent to the developing interval TDEV). The first level may be lower than the precharge level. An operation of discharging the reference TSV with the second discharge speed may represent that the reference TSV (or the reference signal REF) has a second level at the end time of the developing interval TDEV (e.g., at the start time of the sensing interval TSEN). The second level may be lower than the precharge level and higher than the first level.

In other words, at the end time of the developing interval TDEV and at the start time of the sensing interval TSEN, the first data signal D1 may have the precharge level or the first level according to the logic level to be transmitted, and the reference signal REF may always have the second level.

After the transmission of the first through N-th data signals D1, D2, . . . , DN is completed, the N-bit data DAT is sensed based on the level differences between the first through N-th data transmission lines 320a, 320b, . . . , 320n and the reference transmission line 520 during the sensing interval TSEN.

For example, when a value that is obtained by subtracting a level of the reference TSV in the reference transmission line 520 from a level of the first data TSV in the first data transmission line 320a corresponds to a positive value, it may be determined that the first data signal D1 has the first logic level DS1. When the value that is obtained by subtracting the level of the reference TSV from the level of the first data TSV corresponds to a negative value, it may be determined that the first data signal D1 has the second logic level DS2.

While the data transmission is performed, the change of the signal level at the sense amplifiers included in the data receiver 400 (e.g., "SAT") may be similar to the change of the signal level at the transmission lines in the bus 300 (e.g., "BSI"). For example, DS1', DS2' and REF' in curves that represent the change of the signal level at the sense amplifiers included in the data receiver 400 (e.g., "SAT") may correspond to DS1, DS2 and REF in the curves that represent the change of the signal level at the transmission lines in the bus 300 (e.g., "BSI"), respectively, and a level difference between DS1' and DS2' in "SAT" may be greater than a level difference between DS1 and DS2 in "BSI" by an amplifying operation of the sense amplifiers. As a result, the sensed data (e.g., the N-bit data DAT) may be output at the output terminals of the sense amplifiers, as illustrated by curves that represent the change of the signal level the at output terminals of the sense amplifiers (e.g., "SAO") in FIG. 3.

After that, as the N-bit data DAT is sequentially transmitted, such precharge operation, developing operation and sensing operation may be repeated, and the N-bit data DAT may be sequentially sensed and output.

In the method and apparatus according to example embodiments, the discharge speed of the reference transmission line 520 or the discharge speed of the reference node RN may be set or determined such that the reference signal REF always has the second level between the precharge level and the first level at the end time of the developing interval TDEV and at the start time of the sensing interval TSEN. Accordingly, all of the first through N-th data signals D1, D2, . . . , DN may be efficiently sensed based on a single reference signal REF when the first through N-th data signals D1, D2, . . . , DN are transmitted based on the single-ended scheme, not based on the differential scheme.

To transmit N-bit data, one strobe transmission line and 2*N data transmission lines may be utilized in the differential scheme, however, one strobe transmission line 310, one reference transmission line 520 and N data transmission lines 320a, 320b, . . . , 320n may be utilized in the single-ended scheme according to example embodiments. In other words, (2N+1) transmission lines may be utilized to transmit the N-bit data in the differential scheme, and (N+2) transmission lines may be utilized to transmit the N-bit data in the single-ended scheme according to example embodiments. Accordingly, the apparatus 100 may be manufactured with relatively small size and low cost.

In the method and apparatus according to example embodiments, the data transmission lines 320a, 320b, . . . , 320n and the data signals D1, D2, . . . , DN may not fully swing between a high voltage (e.g., a power supply voltage) and a low voltage (e.g., a ground voltage), but may swing within relatively small range according to the logic level to be transmitted, as illustrated by "BSI" in FIG. 3. In addition, a timing of sensing the first through N-th data signals D1, D2, . . . , DN (or the N-bit data DAT) may be determined based on the strobe signal STB. Accordingly, the apparatus 100 may perform the data transmission with relatively low power consumption. Further, the strobe signal STB may be a clock signal, the strobe transmission line 310 and the strobe signal STB may fully swing between the power supply voltage (e.g., VDD voltage) and the ground voltage (e.g., VSS or GND voltage), and thus a drivability of the strobe driver 210 may be higher than the drivability of each of first through N-th data drivers 220a, 220b, . . . , 220n.

In a differential scheme, to transmit N-bit data, N data transmission lines may be discharged regardless of the logic levels to be transmitted. In contrast, in one or more example embodiments, to transmit N-bit data, between zero and N data transmission lines may be discharged according to the logic levels to be transmitted in the single-ended scheme according to example embodiments. Accordingly, N/2 data transmission lines may be discharged on average to transmit the N-bit data in the single-ended scheme according to example embodiments, and thus the apparatus 100 may perform the data transmission with relatively low power consumption.

Additionally, each of the transmission lines 310, 320a, 320b, . . . , 320n and 520 may include a through silicon via (TSV). Generally, a TSV may be a capacitive load that has negligible resistance and heavy capacitance, and thus power consumption P for driving the TSV may be calculated by Equation 1.

$$P = C * V^2 * f \qquad \text{[Equation 1]}$$

In Equation 1, C represents a total capacitance of the TSV, V represents a voltage swing width of a signal that is transmitted through the TSV, and f represents a frequency of the signal that is transmitted through the TSV. Since the frequency (e.g., f in Equation 1) of the signal increases for high speed operation, and since the capacitance (e.g., C in Equation 1) of the TSV increases as integration degree of a semiconductor chip increases, decreasing the voltage swing width (e.g., V in Equation 1) of the signal may reduce the power consumption (e.g., P in Equation 1).

As described above, in the method and apparatus according to example embodiments, the data transmission lines 320a, 320b, . . . , 320n and the data signals D1, D2, . . . , DN may not fully swing between the power supply voltage and the ground voltage, but may swing within relatively small range according to the logic level to be transmitted. Accordingly, the apparatus 100 may efficiently perform the data transmission with relatively high speed and low power consumption.

Figure 4:
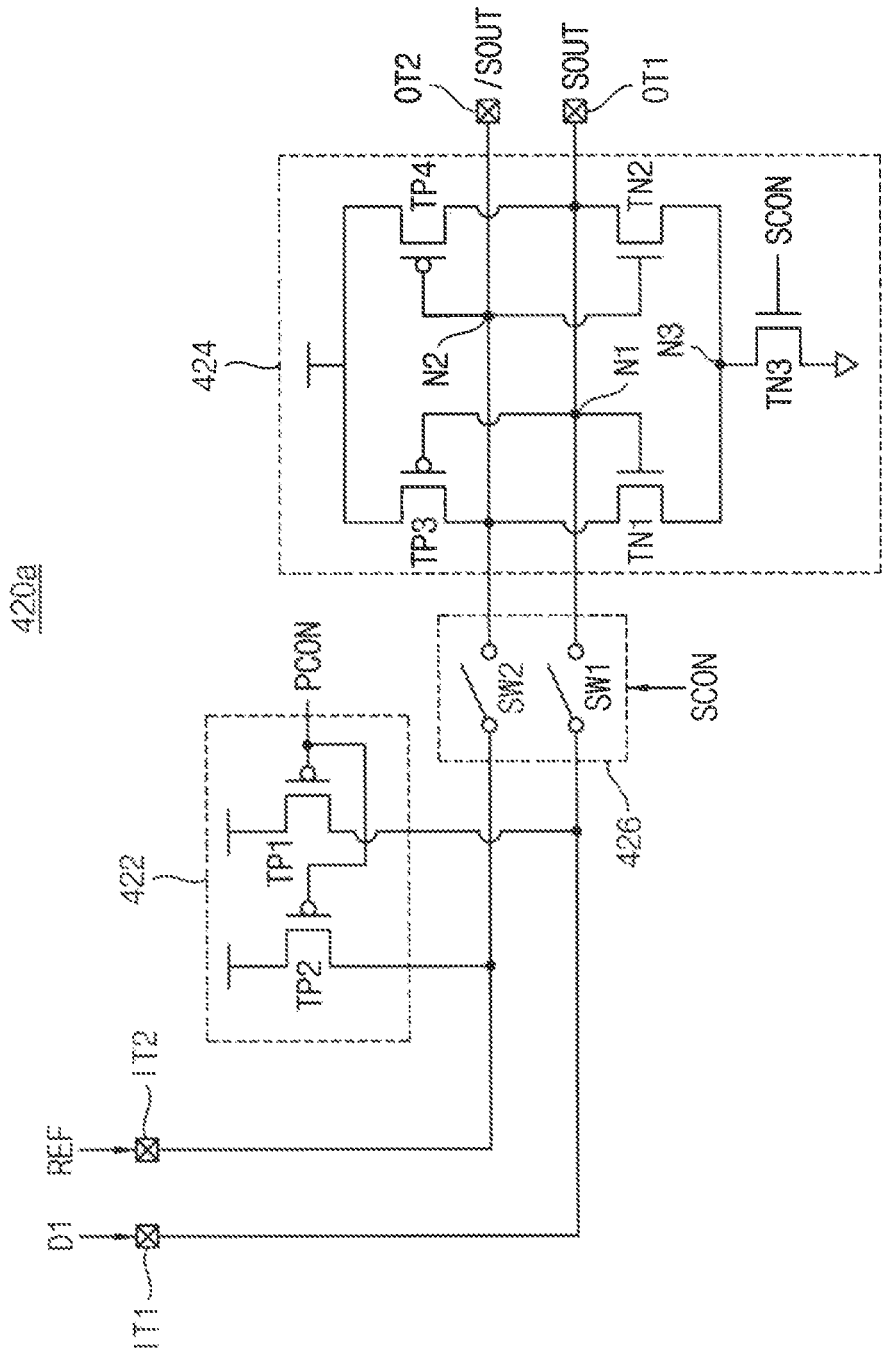
FIG. 4 is a circuit diagram illustrating an example of a sense amplifier that is included in the apparatus of FIG. 2.

FIG. 4 is a circuit diagram illustrating an example of a sense amplifier that is included in the apparatus of FIG. 2.

In a circuit diagram such as FIG. 4, a horizontal line (e.g., -) connected to one end of a transistor or a switch represents a power supply voltage, and an inverted triangle (e.g., ∇) connected to one end of a transistor, a capacitor or a resistor represents a ground voltage.

Referring to FIGS. 2 and 4, a first sense amplifier 420a may include a first input terminal IT1, a second input terminal IT2, a precharge circuit 422 and a sensing circuit 424. The first sense amplifier 420a may further include a switching circuit 426, a first output terminal OT1 and a second output terminal OT2.

The first input terminal IT1 may be connected to the first data transmission line 320a to receive the first data signal D1. The second input terminal IT2 may be connected to the reference transmission line 520 and the reference node RN to receive the reference signal REF.

The precharge circuit 422 may be connected to the precharge voltage (e.g., the power supply voltage) and may precharge the first input terminal IT1 and the second input terminal IT2 based on the precharge control signal PCON during the precharge interval TPREC.

The precharge circuit 422 may include transistors TP1 and TP2. The transistor TP1 may be connected between the power supply voltage and the first input terminal IT1, and may include a control electrode (e.g., a gate electrode) receiving the precharge control signal PCON. The transistor TP2 may be connected between the power supply voltage and the second input terminal IT2, and may include a control electrode receiving the precharge control signal PCON.

The sensing circuit 424 may detect a level difference between the first input terminal IT1 and the second input terminal IT2 based on the sensing control signal SCON during the sensing interval TSEN to sense or output a first bit of the N-bit data DAT. For example, the sensing circuit 424 may detect the logic level of the first data signal D1 based on the level difference between the first data signal D1 and the reference signal REF, as described with reference to FIG. 3.

The sensing circuit 424 may include transistors TP3, TP4, TN1, TN2 and TN3. The transistor TP3 may be connected between the power supply voltage and a node N2, and may include a control electrode connected to a node N1. The transistor TP4 may be connected between the power supply voltage and the node N1, and may include a control electrode connected to the node N2. The transistor TN1 may be connected between the node N2 and a node N3, and may include a control electrode connected to the node Ni. The transistor TN2 may be connected between the node N1 and the node N3, and may include a control electrode connected to the node N2. The transistor TN3 may be connected between the node N3 and the ground voltage, and may include a control electrode receiving the sensing control signal SCON.

The switching circuit 426 may electrically disconnect the first and second input terminals IT1 and IT2 with the sensing circuit 424 based on the sensing control signal SCON during the sensing interval TSEN.

The switching circuit 426 may include a first switch SW1 and a second switch SW2. The first switch SW1 may be connected between the first input terminal IT1 and the node N1, and may be opened or closed based on the sensing control signal SCON. The second switch SW2 may be connected between the second input terminal IT2 and the node N2, and may be opened or closed based on the sensing control signal SCON.

The first output terminal OT1 may be connected to the node N1, and may provide an output signal SOUT. The second output terminal OT2 may be connected to the node N2, and may provide an inversion signal /SOUT of the output signal SOUT.

In some example embodiments, each of the transistors TP1, TP2, TP3 and TP4 may be a p-type metal oxide semiconductor (PMOS) transistor, and each of the transistors TN1, TN2 and TN3 may be an n-type metal oxide semiconductor (NMOS) transistor. In other example embodiments, types of the transistors TP1, TP2, TP3, TP4, TN1, TN2 and TN3 may be changed.

Although not illustrated in FIG. 4, a configuration of the remainder of the sense amplifiers 420b, . . . , 420n other than the first sense amplifier 420a may be substantially the same as a configuration of the first sense amplifier 420a illustrated in FIG. 4.

Figure 5:
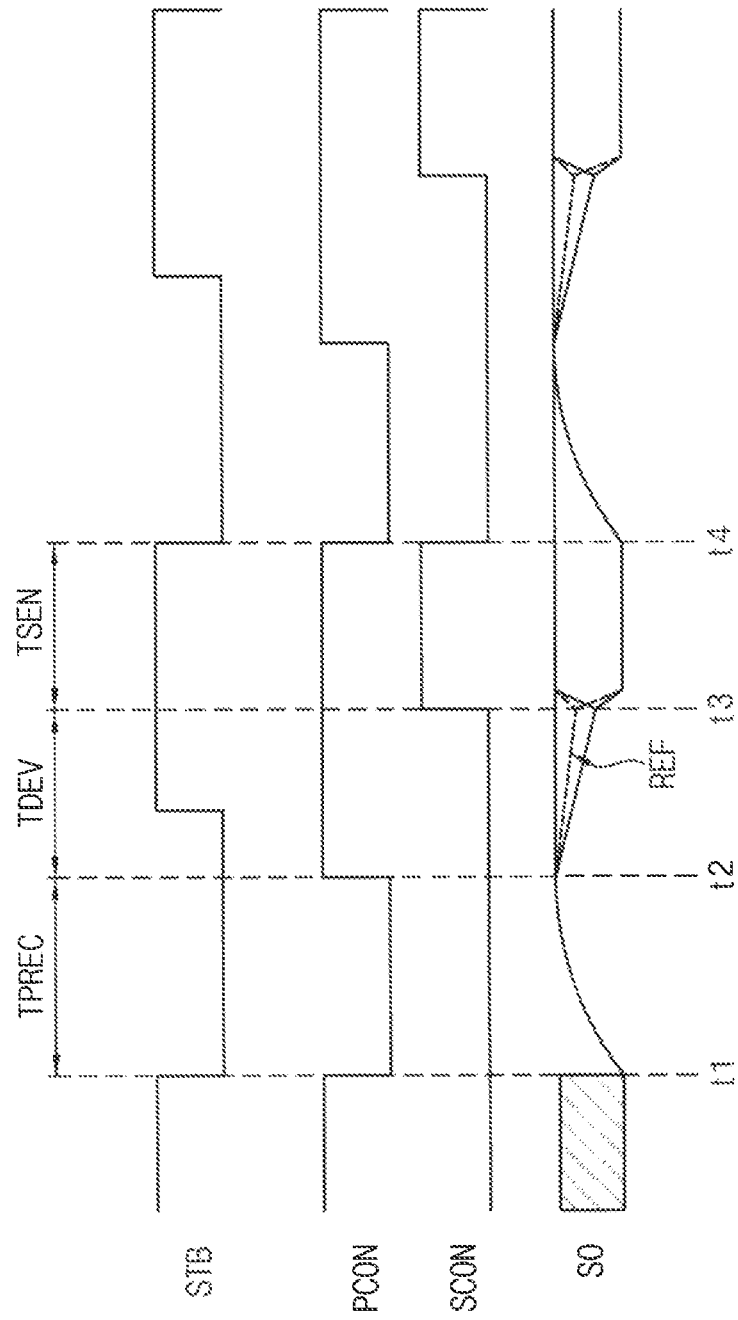
FIG. 5 is a timing diagram for describing an operation of the sense amplifier of FIG. 4.

FIG. 5 is a timing diagram for describing an operation of the sense amplifier of FIG. 4. In FIG. 5, "SO" represents level changes at the output terminals OT1 and OT2 in the first sense amplifier 420a, e.g., level changes of the output signals SOUT and /SOUT.

Referring to FIGS. 2, 4 and 5, the strobe buffer 410 may generate the precharge control signal PCON and the sensing control signal SCON based on the strobe signal STB. In addition, the strobe buffer 410 may control or adjust a length of the precharge interval TPREC, a length of the developing interval TDEV and a length of the sensing interval TSEN based on the strobe signal STB, the precharge control signal PCON and the sensing control signal SCON.

At time t1, the precharge control signal PCON is transitioned from a logic high level to a logic low level in response to a falling edge of the strobe signal STB, and thus the precharge interval TPREC begins. The precharge circuit 422 may precharge the first input terminal IT1 and the second input terminal IT2 based on the precharge voltage (e.g., the power supply voltage) during the precharge interval TPREC. The first data transmission line 320a that is connected to the first input terminal IT1 and the reference transmission line 520 and the reference node RN that are connected to the second input terminal IT2 may be precharged to the same level (e.g., the precharge level).

At time t2, the precharge control signal PCON is transitioned from the logic low level to the logic high level, and thus the precharge interval TPREC terminates and the developing interval TDEV begins. The first data transmission line 320a that is connected to the first input terminal IT1 may be maintained to the precharge level or discharged with the first discharge speed according to the logic level of the first data signal D1 to be transmitted, as illustrated by a solid line in "SO" of FIG. 5. The reference transmission line 520 and the reference node RN that are connected to the second input terminal IT2 may be discharged with the second discharge speed that is slower than the first discharge speed, as illustrated by a dotted line in "SO" of FIG. 5.

At time t3, the sensing control signal SCON is transitioned from the logic low level to the logic high level, and thus the developing interval TDEV terminates and the sensing interval TSEN begins. The first and second switches SW1 and SW2 are opened based on the sensing control signal SCON, and the sensing circuit 424 may detect the level difference between the first input terminal IT1 and the second input terminal IT2 (e.g., the level difference between the nodes N1 and N2) during the sensing interval TSEN to sense or output the first bit of the N-bit data DAT.

At time t4, each of the precharge control signal PCON and the sensing control signal SCON is transitioned from the logic high level to the logic low level in response to another falling edge of the strobe signal STB, and a next precharge interval begins.

In some example embodiments, the strobe buffer 410 may control or adjust the length of the precharge interval TPREC and the length of the developing interval TDEV by changing time t2, and may control or adjust the length of the developing interval TDEV and the length of the sensing interval TSEN by changing time t3.

Figure 6:
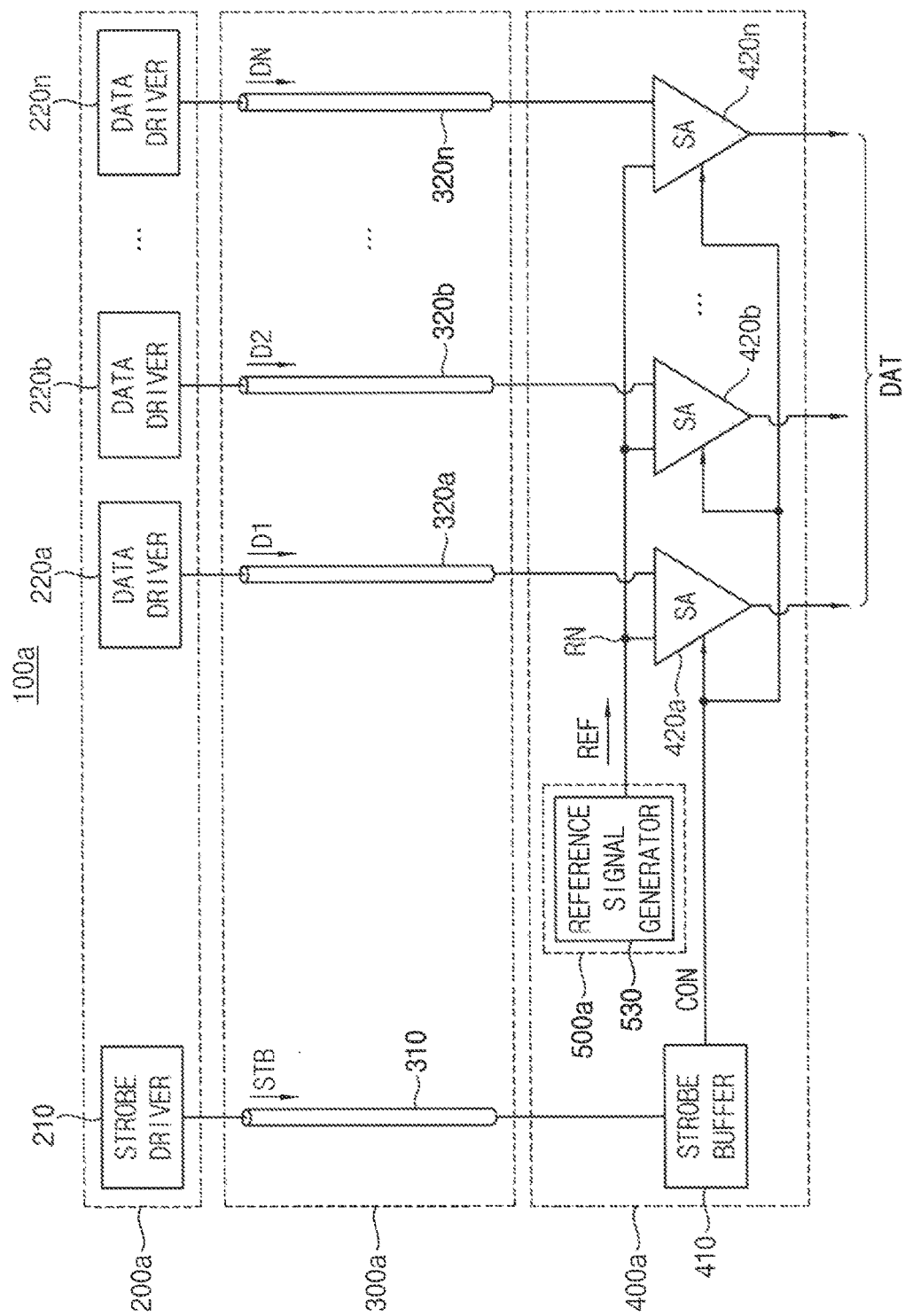
FIG. 6 is a block diagram illustrating an apparatus of transmitting and receiving data according to example embodiments.

FIG. 6 is a block diagram illustrating an apparatus of transmitting and receiving data according to example embodiments.

Referring to FIG. 6, an apparatus 100a of transmitting and receiving data includes a data transmitter 200a, a bus 300a, a data receiver 400a and a reference signal supplier 500a.

The apparatus 100a of FIG. 6 may be substantially the same as the apparatus 100 of FIG. 2, except that a configuration of the reference signal supplier 500a in FIG. 6 is changed and configurations of the data transmitter 200a, the bus 300a and the data receiver 400a are partially changed. The apparatus 100a of FIG. 6 may also operate based on an example described with reference to FIGS. 3, 4 and 5. Thus, repeated explanation will be omitted.

The reference signal supplier 500a may include a reference signal generator 530. The reference signal generator 530 may be included or located in the data receiver 400a, may be connected to the reference node RN, and may generate the reference signal REF.

In comparison with the apparatus 100 of FIG. 2, the apparatus 100a of FIG. 6 may include the reference signal generator 530 that is located in the data receiver 400a, and thus elements for providing the reference signal REF from the data transmitter 200a to the data receiver 400a may not be required in the apparatus 100a of FIG. 6. In other words, the data transmitter 200a may not include the reference driver 510, the bus 300a may not include the reference transmission line 520, and thus the number of transmission lines included in the bus 300a may be reduced.

Figure 7:
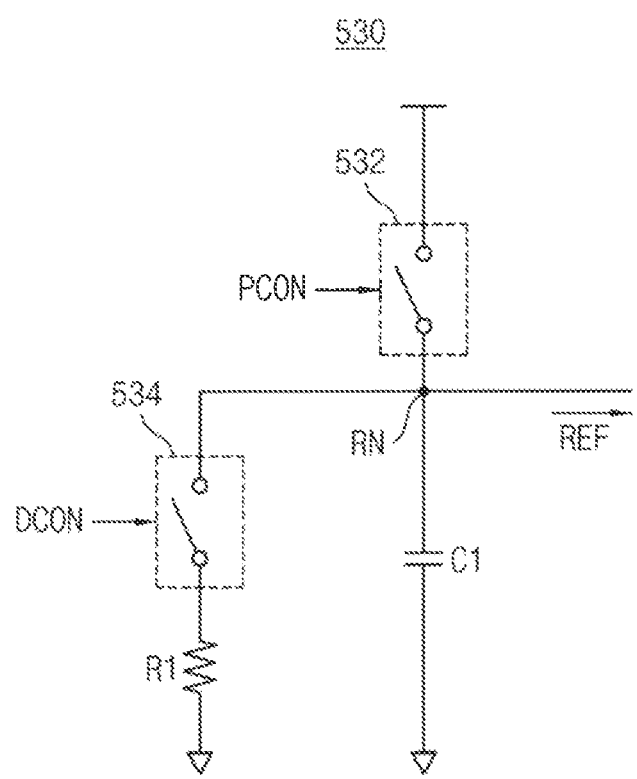
FIG. 7 is a circuit diagram illustrating an example of a reference signal generator that is included in the apparatus of FIG. 6.

FIG. 7 is a circuit diagram illustrating an example of a reference signal generator that is included in the apparatus of FIG. 6.

Referring to FIGS. 6 and 7, a reference signal generator 530 may include a first capacitor C1, a first resistor R1, a first switch 532 and a second switch 534.

The first capacitor C1 and the first resistor R1 may be connected in parallel between the reference node RN providing the reference signal REF and the ground voltage.

The first switch 532 may be connected between the precharge voltage (e.g., the power supply voltage) and the reference node RN. The first switch 532 may precharge the reference node RN during the precharge interval TPREC. The first switch 532 may be opened or closed based on the precharge control signal PCON. For example, the first switch 532 may be closed during the precharge interval TPREC and may be opened during the remaining interval.

The second switch 534 may be connected between the reference node RN and the first resistor R1. The second switch 534 may discharge the reference node RN with the second discharge speed during the developing interval TDEV. As described above, the second discharge speed may be slower than the first discharge speed of the first through N-th data transmission lines 320a, 320b, . . . , 320n. The second switch 534 may be opened or closed based on the developing control signal DCON. For example, the second switch 534 may be closed during the developing interval TDEV and may be opened during the remaining interval.

In some example embodiments, the strobe buffer 410 may further generate the developing control signal DCON that is activated during the developing interval TDEV. In other example embodiments, the developing control signal DCON that is applied to the second switch 534 may be replaced with a combination of the precharge control signal PCON and the sensing control signal SCON.

In some example embodiments, a resistance of the first resistor R1 and a capacitance of the first capacitor C1 may be determined such that the second discharge speed is slower than the first discharge speed. As described with reference to FIG. 2, a drivability of each driver (e.g., each of the first through N-th data drivers 220a, 220b, . . . , 220n) may be determined based on a resistance of each driver and a capacitance of each transmission line connected to each driver. Thus, the resistance of the first resistor R1 and the capacitance of the first capacitor C1 may be determined based on a resistance of each of the first through N-th data drivers 220a, 220b, . . . , 220n and a capacitance of each of the first through N-th data transmission lines 320a, 320b, . . . , 320n such that the second discharge speed is slower than the first discharge speed. Generally, a time constant increases and a discharge speed decreases as a resistance and a capacitance increase, and thus the first resistor R1 may have relatively large (or heavy) resistance and/or the first capacitor C1 may have relatively large (or heavy) capacitance.

Figure 8:
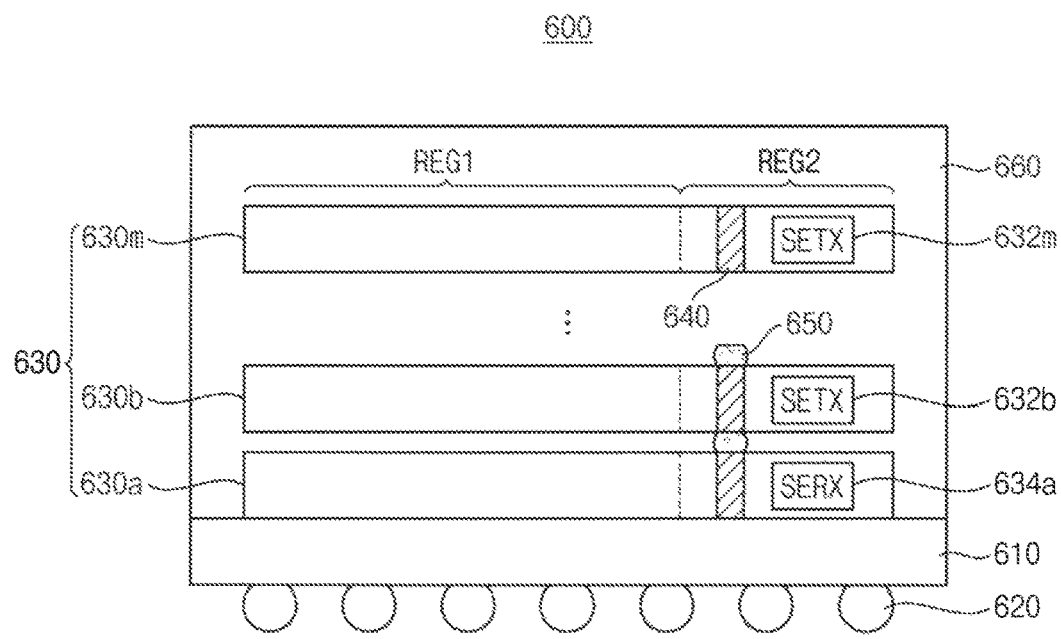
FIGS. 8, 9 and 10 are cross-sectional views of a semiconductor package including the apparatus according to example embodiments.
Figure 9:
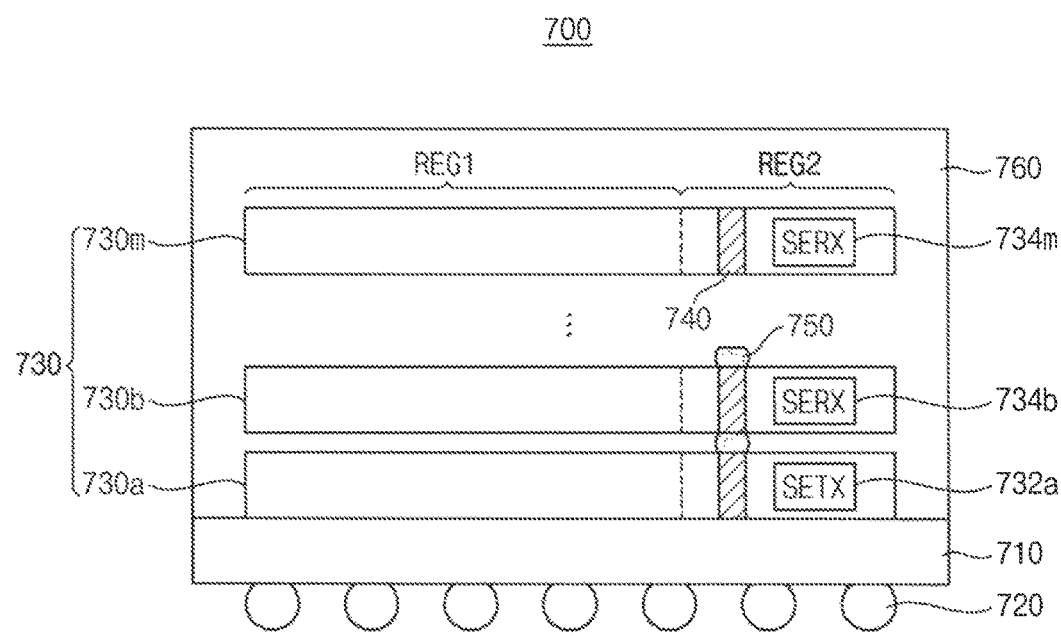
Figure 10:
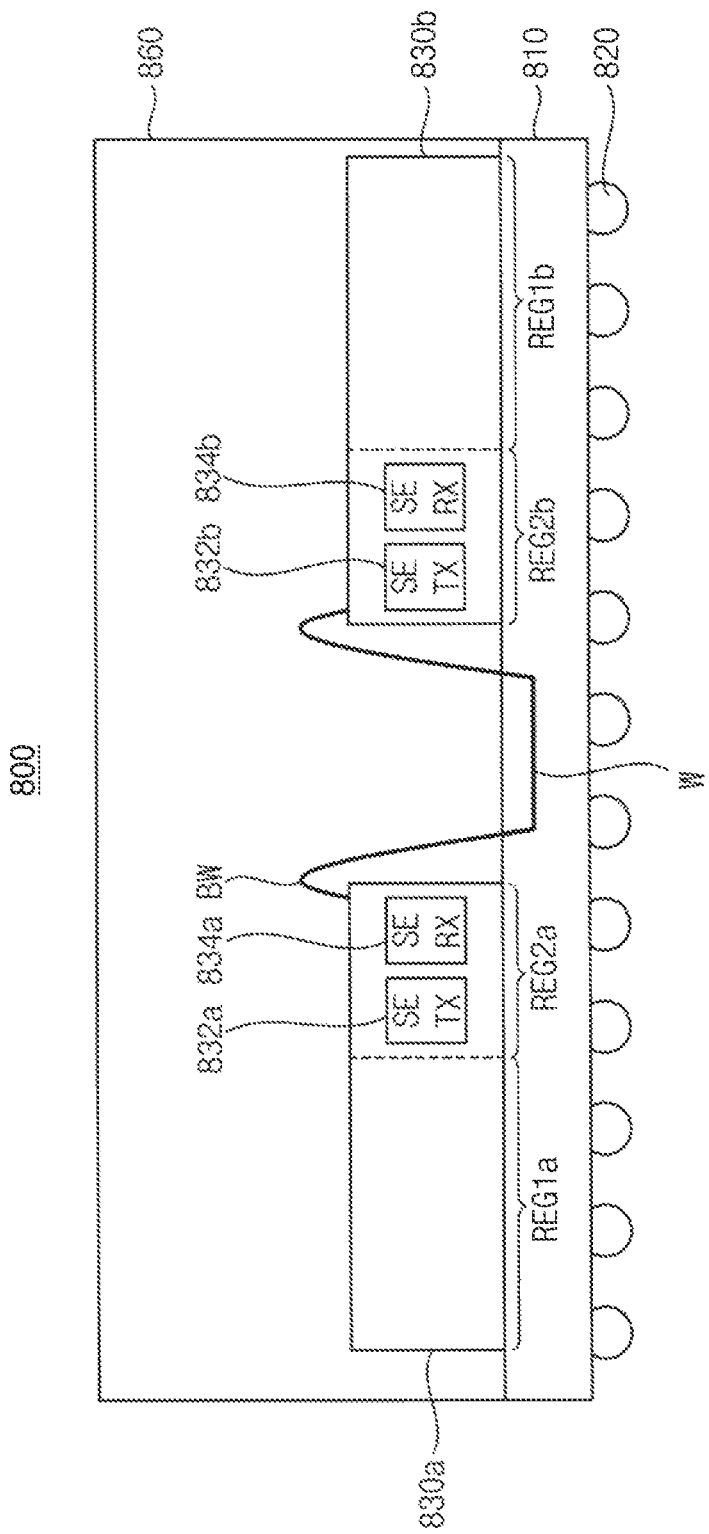

FIGS. 8, 9 and 10 are cross-sectional views of a semiconductor package including the apparatus according to example embodiments.

Referring to FIG. 8, a semiconductor package 600 includes a substrate (e.g., a package substrate or a base substrate) 610 and a plurality of semiconductor chips 630. The semiconductor package 600 may further include a plurality of conductive bumps 620, a plurality of TSVs 640, a plurality of conductive materials 650 and a sealing member 660.

The plurality of semiconductor chips 630 may include first through M-th semiconductor chips 630a, 630b, . . . , 630m that are formed on the substrate 610, where M is a natural number. The plurality of semiconductor chips 630 may be implemented as a multi-stacked chip package in which the first through M-th semiconductor chips 630a, 630b, . . . , 630m are sequentially stacked on one another. For example, the first semiconductor chip 630a may be formed or disposed on the substrate 610, the second semiconductor chip 630b may be formed or disposed on the first semiconductor chip 630a, and the M-th semiconductor chip 630m may be formed or disposed on an (M-1)-th semiconductor chip (not shown).

The first through M-th semiconductor chips 630a, 630b, . . . , 630m may be divided into a first region REG1 and a second region REG2. Main elements may be disposed or arranged in the first region REG1, and subsidiary elements may be disposed or arranged in the second region REG2. For example, when each of the first through M-th semiconductor chips 630a, 630b, . . . , 630m is a memory chip, a plurality of memory cells may be disposed in the first region REG1, and row decoders, data input/output (I/O) circuits, etc. may be disposed in the second region REG2. The first region REG1 may be referred to as a core region, a central region or a cell region, and the second region REG2 may be referred to as a peripheral region.

The first through M-th semiconductor chips 630a, 630b, . . . , 630m may include the plurality of TSVs 640 that are formed or disposed in the second region REG2. Each of the plurality of TSVs 640 may be formed by penetrating a part or all of at least one of a first through M-th semiconductor substrates on which the first through M-th semiconductor chips 630a, 630b, . . . , 630m are formed, respectively.

In some example embodiments, with respect to each of the first through M-th semiconductor chips 630a, 630b, . . . , 630m, the plurality of TSVs 640 may be arranged at the same locations in each semiconductor chip. As such, the first through M-th semiconductor chips 630a, 630b, . . . , 630m may be stacked such that the plurality of TSVs 640 of each semiconductor chip may be completely overlapped (e.g., arrangements of the plurality of TSVs 640 may be perfectly matched in the semiconductor chips 630a, 630b, . . . , 630m). In such stacked structure, the first through M-th semiconductor chips 630a, 630b, . . . , 630m may be electrically connected to one another and the substrate 610 through the plurality of TSVs 640 and the plurality of conductive materials 650. The plurality of conductive bumps 620 may be disposed on a bottom surface of the substrate 610 for electrical connections to an external device. The stacked semiconductor chips 630a, 630b, . . . , 630m may be fixed by the sealing member 660. Although not illustrated in FIG. 8, adhesive members may intervene between the stacked semiconductor chips 630a, 630b, . . . , 630m.

In some example embodiments, the lowermost semiconductor chip 630a among the plurality of semiconductor chips 630 may operate as a master chip, and the remainder of the plurality of semiconductor chips 630 other than the lowermost semiconductor chip 630a may operate as a slave chip. The first semiconductor chip 630a which operates as the master chip may be connected to the external device and may directly communicate with the external device. Each of the second through M-th semiconductor chips 630b, . . . , 630m which operates as the slave chip may communicate with the external device through the first semiconductor chip 630a. Thus, a high speed I/O operation may be implemented based on one chip loading.

In addition, to perform the high speed I/O operation, the semiconductor package 600 may include the apparatus according to example embodiments.

For example, the first semiconductor chip 630a may include a single-ended data receiver (SERX) 634a that is formed or disposed in the second region REG2. The second through M-th semiconductor chips 630b, . . . , 630m may include single-ended data transmitters (SETXs) 632b, . . . , 632m, respectively, that are formed or disposed in the second region REG2.

The single-ended data receiver 634a may be the data receiver 400 described with reference to FIGS. 2 through 5 or the data receiver 400a described with reference to FIGS. 6 and 7. Each of the single-ended data transmitters 632b, . . . , 632m may be the data transmitter 200 described with reference to FIGS. 2 through 5 or the data transmitter 200a described with reference to FIGS. 6 and 7. The plurality of TSVs 640 and a plurality of wires (not shown) for connecting the single-ended data receiver 634a with the single-ended data transmitters 632b, . . . , 632m may form the bus 300 described with reference to FIGS. 2 through 5 or the bus 300a described with reference to FIGS. 6 and 7. For example, the plurality of TSVs 640 may include a strobe TSV and data TSVs, and may further include reference TSV. As described with reference to FIGS. 2 through 5, the reference signal supplier 500 may be included or located in the data transmitters 200 and the bus 300. As described with reference to FIGS. 6 and 7, the reference signal supplier 500a may be included or located in the data receiver 400a.

As described above, when the semiconductor package 600 includes the apparatus that is manufactured with relatively small size and low cost according to example embodiments, the first semiconductor chip 630a may efficiently receive data from at least one of the second through M-th semiconductor chips 630b, . . . , 630m with relatively high speed and low power consumption, and may provide the received data to the external device.

Referring to FIG. 9, a semiconductor package 700 includes a substrate 710 and a plurality of semiconductor chips 730. The semiconductor package 700 may further include a plurality of conductive bumps 720, a plurality of TSVs 740, a plurality of conductive materials 750 and a sealing member 760.

The substrate 710, the plurality of conductive bumps 720, the plurality of TSVs 740, the plurality of conductive materials 750 and the sealing member 760 in FIG. 9 may be substantially the same as the substrate 610, the plurality of conductive bumps 620, the plurality of TSVs 640, the plurality of conductive materials 650 and the sealing member 660 in FIG. 8, respectively. Thus, repeated explanation will be omitted.

The semiconductor package 700 may include the apparatus according to example embodiments. For example, a first semiconductor chip 730a which operates as a master chip may include a single-ended data transmitter 732a that is formed or disposed in the second region REG2. Second through M-th semiconductor chips 730b, . . . , 730m which operate as a slave chip may include single-ended data receivers 734b, . . . , 734m, respectively, that are formed or disposed in the second region REG2. The single-ended data transmitter 732a may be the data transmitter 200 in FIG. 2 or the data transmitter 200a in FIG. 6. Each of the single-ended data receivers 734b, . . . , 734m may be the data receiver 400 in FIG. 2 or the data receiver 400a in FIG. 6.

The plurality of TSVs 640 may form the bus 300 in FIG. 2 or the bus 300a in FIG. 6. The reference signal supplier may be included or located in the single-ended data transmitter 732a or each of the single-ended data receivers 734b, . . . , 734m.

As described above, when the semiconductor package 700 includes the apparatus that is manufactured with relatively small size and low cost according to example embodiments, the first semiconductor chip 730a may efficiently transmit data from the external device to at least one of the second through M-th semiconductor chips 730b, . . . , 730m with relatively high speed and low power consumption.

Although FIGS. 8 and 9 illustrate examples where the master chip includes one of the data transmitter and the data receiver and each of the slave chips includes the other of the data transmitter and the data receiver, the example embodiments may not be limited thereto. For example, each of the master and slave chips may include both the data transmitter and the data receiver for bidirectional communication.

Referring to FIG. 10, a semiconductor package 800 includes a substrate 810 and a plurality of semiconductor chips 830a and 830b. The semiconductor package 800 may further include a plurality of conductive bumps 820, a plurality of bonding wires BW, a plurality of wires W and a sealing member 860.

The substrate 810, the plurality of conductive bumps 820 and the sealing member 860 in FIG. 10 may be substantially the same as the substrate 610, the plurality of conductive bumps 620 and the sealing member 660 in FIG. 8, respectively. Thus, repeated explanation will be omitted.

The plurality of semiconductor chips 830a and 830b may include first and second semiconductor chips 830a and 830b that are formed on the substrate 810. The first and second semiconductor chips 830a and 830b may be disposed or arranged on the same plane and may be spaced apart from each other. The first semiconductor chip 830a may be divided into a first region REG1a and a second region REG2a, and the second semiconductor chip 830b may be divided into a first region REG1b and a second region REG2b. The first and second semiconductor chips 830a and 830b may be electrically connected to each other by the plurality of bonding wires BW that are formed on the second regions REG2a and REG2b and the plurality of wires W that are formed in the substrate 810.

The semiconductor package 800 may include the apparatus according to example embodiments. For example, the first semiconductor chip 830a may include a single-ended data transmitter 832a and a single-ended data receiver 834a that are formed or disposed in the second region REG2a. The second semiconductor chip 830b may include a single-ended data transmitter 832b and a single-ended data receiver 834b that are formed or disposed in the second region REG2b. Each of the single-ended data transmitters 832a and 832b may be the data transmitter 200 in FIG. 2 or the data transmitter 200a in FIG. 6. Each of the single-ended data receivers 834a and 834b may be the data receiver 400 in FIG. 2 or the data receiver 400a in FIG. 6. The plurality of bonding wires BW and the plurality of wires W may form the bus 300 in FIG. 2 or the bus 300a in FIG. 6. The reference signal supplier may be included or located in each of the single-ended data transmitters 832a and 832b or each of the single-ended data receivers 834a and 834b.

Using the single-ended data transmitter 832a and the single-ended data receiver 834b, data may be transmitted from the first semiconductor chip 830a to the second semiconductor chip 830b with relatively high speed and low power consumption. Using the single-ended data transmitter 832b and the single-ended data receiver 834a, data may be transmitted from the second semiconductor chip 830b to the first semiconductor chip 830a with relatively high speed and low power consumption.

Figure 11:
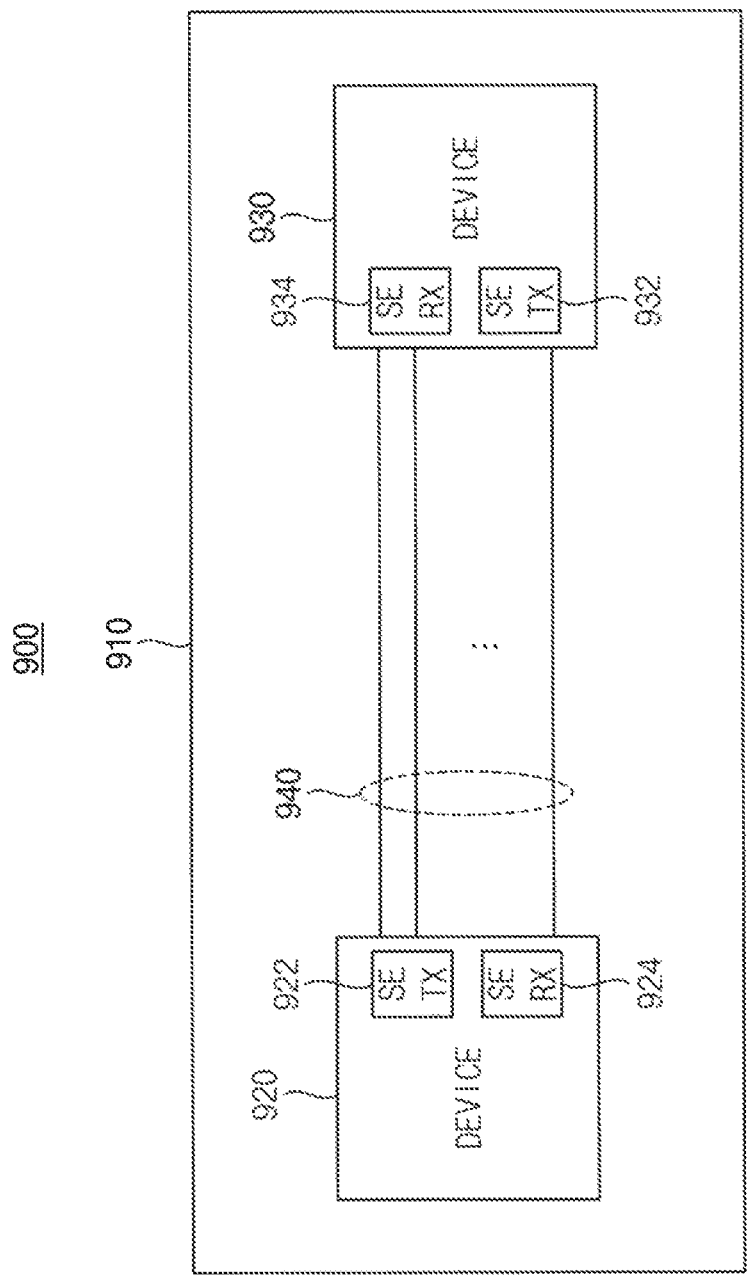
FIG. 11 is a plan view of a semiconductor system including the apparatus according to example embodiments.

FIG. 11 is a plan view of a semiconductor system including the apparatus according to example embodiments.

Referring to FIG. 11, a semiconductor system 900 includes a substrate 910, a plurality of semiconductor devices 920 and 930, and a plurality of transmission lines 940.

The plurality of semiconductor devices 920 and 930 may be mounted or disposed on the substrate 910. For example, the substrate 910 may be a printed circuit board (PCB) or a flexible PCB (FPCB). The plurality of semiconductor devices 920 and 930 may be connected to each other via the plurality of transmission lines 940.

The semiconductor system 900 may include the apparatus according to example embodiments. For example, the semiconductor device 920 may include a single-ended data transmitter 922 and a single-ended data receiver 924. The semiconductor device 930 may include a single-ended data transmitter 932 and a single-ended data receiver 934. Each of the single-ended data transmitters 922 and 932 may be the data transmitter 200 in FIG. 2 or the data transmitter 200a in FIG. 6. Each of the single-ended data receivers 924 and 934 may be the data receiver 400 in FIG. 2 or the data receiver 400a in FIG. 6. The plurality of transmission lines 940 may form the bus 300 in FIG. 2 or the bus 300a in FIG. 6. The reference signal supplier may be included or located in each of the single-ended data transmitters 922 and 932 or each of the single-ended data receivers 924 and 934. Using the single-ended data transmitters 922 and 932 and the single-ended data receivers 924 and 934, data may be transmitted from one of the semiconductor devices 920 and 930 to the other of the semiconductor devices 920 and 930 with relatively high speed and low power consumption.

Figure 12:
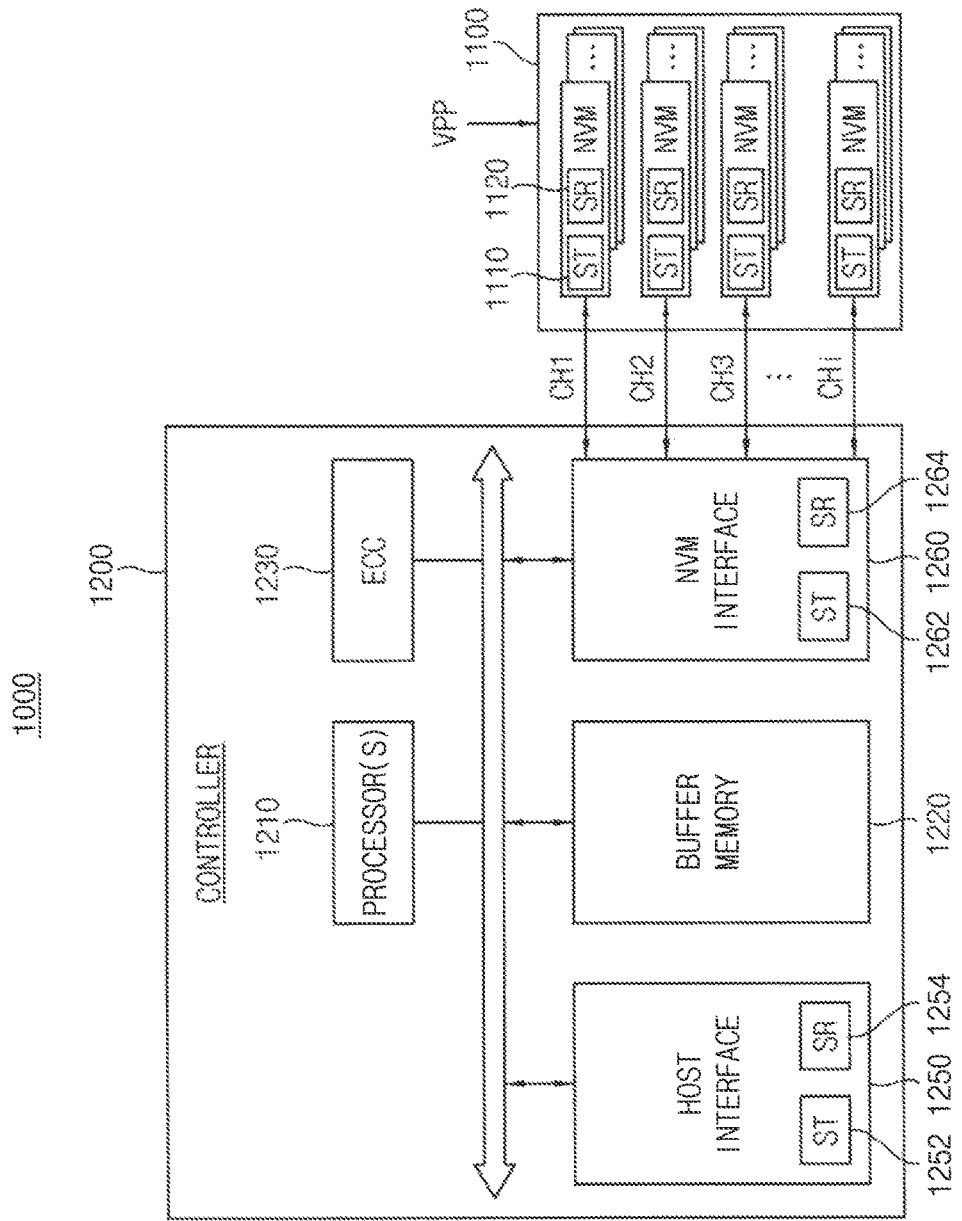
FIG. 12 is a block diagram illustrating a storage device including the apparatus according to example embodiments.

FIG. 12 is a block diagram illustrating a storage device including the apparatus according to example embodiments.

Referring to FIG. 12, a storage device 1000 may include a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc. Each of the nonvolatile memory devices 1100 may be optionally supplied with an external high voltage VPP.

The controller 1200 may be connected to the nonvolatile memory devices 1100 via a plurality of channels CH1, CH2, CH3, . . . , CHi. The controller 1200 may include one or more processors 1210, a buffer memory 1220, an error correction code (ECC) circuit 1230, a host interface 1250, and a nonvolatile memory interface 1260.

The buffer memory 1220 may store data used to drive the controller 1200 and may buffer data to be programmed based on a write or program command. The ECC circuit 1230 may calculate error correction code values of data to be programmed during a program operation, and may correct an error of read data using an error correction code value during a read operation. In a data recovery operation, the ECC circuit 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the host interface 1250, the nonvolatile memory interface 1260 and the nonvolatile memory devices 1100 may include the apparatus according to example embodiments. For example, the host interface 1250 may include a data transmitter 1252 and a data receiver 1254 that form the apparatus according to example embodiments, the nonvolatile memory interface 1260 may include a data transmitter 1262 and a data receiver 1264 that form the apparatus according to example embodiments, and each of the nonvolatile memory devices 1100 may include a data transmitter 1110 and a data receiver 1120 that form the apparatus according to example embodiments.

Example embodiments may be used in various integrated circuits, devices and/or systems including the apparatus of transmitting and receiving data, such as a personal computer, a laptop computer, a mobile phone, a smart phone, a tablet computer, a personal digital assistants (PDA), an enterprise digital assistant (EDA), a portable multimedia player (PMP), a digital camera, a music player, a portable game console, a navigation device, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus configured to transmit and receive data, the apparatus comprising:
   a data transmitter including first through N-th data drivers and a strobe driver, the first through N-th data drivers configured to generate first through N-th data signals, respectively, and the strobe driver configured to generate a strobe signal, N being a natural number;
   a data receiver including first through N-th sense amplifiers and a strobe buffer, the strobe buffer configured to generate a control signal based on the strobe signal, and the first through N-th sense amplifiers configured to sense N-bit data based on the control signal, a reference signal and the first through N-th data signals;
   a bus including a strobe through silicon via (TSV) and first through N-th data TSVs, the strobe TSV configured to connect the strobe driver with the strobe buffer, and the first through N-th data TSVs configured to connect the first through N-th data drivers with the first through N-th sense amplifiers, respectively; and
   a reference signal supplier configured to adjust the reference signal such that a discharge speed of the reference signal is slower than a discharge speed of each of the first through N-th data signals during data transmission.

2. The apparatus of claim 1, wherein the reference signal supplier includes:
   a reference driver associated with the data transmitter, a driving capacity of the reference driver being lower than that of each of the first through N-th data drivers.

3. The apparatus of claim 2, wherein the reference driver and the first through N-th sense amplifiers are connected via a reference TSV associated with the bus.

4. The apparatus of claim 3, wherein the apparatus is configured to,
  precharge the first through N-th data TSVs and the reference TSV to a precharge level during a precharge interval occurring before the first through N-th data signals are transmitted,
  maintain each of the first through N-th data TSVs at the precharge level or discharge each of the first through N-th data TSVs at a first discharge speed according to a logic level transmitted during a developing interval when transmission of the first through N-th data signals begins,
  discharge the reference TSV at a second discharge speed during the developing interval, the second discharge speed being slower than the first discharge speed, and
  sense the N bit data based on level differences between the first through N-th data TSVs and the reference TSV during a sensing interval occurring after the transmission of the first through N-th data signals is completed.

5. The apparatus of claim 4, wherein:
  after discharging at least one of the first through N-th data TSVs at the first discharge speed during the developing interval, the at least one of the first through Nth data TSV has a first level lower than the precharge level at a start time of the sensing interval, and
  after discharging the reference TSV at the second discharge speed during the developing interval, the discharged reference TSV has a second level lower than the precharge level and higher than the first level at the start time of the sensing interval.

6. The apparatus of claim 2, wherein a size of a transistor associated with the reference driver is different from a size of transistors associated with the first through N-th data drivers.

7. The apparatus of claim 1, wherein the reference signal supplier includes:
  a reference signal generator associated with the data receiver, the reference signal generator configured to generate the reference signal.

8. The apparatus of claim 7, wherein during a developing interval, at least one of the first through N-th data TSVs is discharged at a first discharge speed, and the reference signal generator includes:
  a first capacitor and a first resistor connected in parallel between a reference node and a ground voltage, the reference node having the reference signal applied thereto;
  a first switch connected between a precharge voltage and the reference node, the first switch configured to precharge the reference node during a precharge interval; and
  a second switch connected between the reference node and the first resistor, the second switch configured to discharge the reference node during the developing interval such that a reference TSV associated with the bus is discharged at a second discharge speed, the second discharge speed being slower than the first discharge speed.

9. The apparatus of claim 8, wherein a resistance of the first resistor and a capacitance of the first capacitor is based on a resistance of each of the first through N-th data drivers and a capacitance of each of the first through N-th data TSVs such that the second discharge speed is slower than the first discharge speed.

10. The apparatus of claim 1, wherein the first through N-th sense amplifiers each include:
  a first input terminal connected to the first data TSV such that the first input terminal is configured to receive a respective one of the first through N-th data signals;
  a second input terminal configured to receive the reference signal;
  a precharge circuit configured to precharge the first input terminal and the second input terminal based on a precharge control signal during a precharge interval; and
  a sensing circuit configured to sense a first bit of the N bit data by detecting a level difference between the first input terminal and the second input terminal based on a sensing control signal during a sensing interval.

11. The apparatus of claim 10, wherein:
  the control signal includes the precharge control signal and the sensing control signal, and
  the strobe buffer is configured to generate the precharge control signal and the sensing control signal based on the strobe signal.

12. The apparatus of claim 11, wherein the strobe buffer is configured to control a length of the precharge interval, a length of the sensing interval, and a length of a developing interval based on the strobe signal, the developing interval being between the precharge interval and the sensing interval.

13. A method of transmitting and receiving data, the method comprising:
  precharging first through N-th data transmission lines and a reference node to a precharge level during a precharge interval occurring before first through N-th data signals are transmitted, the first through N-th data transmission lines configured to transmit the first through N-th data signals, the reference node configured to receive a reference signal, N being a natural number;
  maintaining each of the first through N-th data transmission lines to the precharge level or discharging each of the first through N-th data TSVs at a first discharge speed according to a logic level transmitted during a developing interval occurring transmission of the first through N-th data signals begins;
  discharging the reference node at a second discharge speed during the developing interval, the second discharge speed being slower than the first discharge speed; and
  sensing logic levels of each bit of N-bit data based on level differences between the first through N-th data transmission lines and the reference node during a sensing interval occurring after the transmission of the first through N-th data signals is completed.

14. The method of claim 13, wherein the first through N-th data transmission lines include first through N-th data through silicon vias (TSVs) that penetrate a semiconductor substrate.

15. The method of claim 13, wherein discharging the reference node at the second discharge speed during the developing interval includes:
  discharging, by a reference driver, the reference node with the second discharge speed, the reference driver having a driving capacity that is lower than that of each of first through N-th data drivers providing the first through N-th data signals.

16. The method of claim 13, wherein discharging the reference node at the second discharge speed during the developing interval includes:
  discharging, by a reference signal generator, the reference node at the second discharge speed, the reference signal generator including a first capacitor and a first resistor connected in parallel between the reference node and a ground voltage, and wherein a resistance of the first resistor and a capacitance of the first capacitor are based on a resistance of each of first through N-th data drivers and a capacitance of each of the first through N-th data transmission lines such that the second discharge speed is slower than the first discharge speed.

17. A semiconductor package comprising:

a substrate;

a first semiconductor chip on the substrate, the first semiconductor chip including a data transmitter, the data transmitter including first through N-th data drivers and a strobe driver, the first through N-th data drivers configured to provide first through N-th data signals, respectively, where N is a natural number, and the strobe driver configured to provide a strobe signal;

a second semiconductor chip on the substrate, the second semiconductor chip including a data receiver, the data receiver including first through N-th sense amplifiers and a strobe buffer, the strobe buffer configured to generate a control signal based on the strobe signal, and the first through N-th sense amplifiers configured to sense N-bit data based on the control signal, a reference signal and the first through N-th data signals;

a bus between the first semiconductor chip and the second semiconductor chip, the bus including a strobe transmission line and first through N-th data transmission lines, the strobe transmission line connecting the strobe driver with the strobe buffer, and the first through N-th data transmission lines connecting the first through N-th data drivers with the first through N-th sense amplifiers, respectively; and a reference signal supplier configured to adjust the reference signal such that a discharge speed of the reference signal is slower than a discharge speed of each of the first through N-th data signals during data transmission.

18. The semiconductor package of claim 17, wherein:

the first semiconductor chip is on the second semiconductor chip, the strobe transmission line includes a strobe through silicon via (TSV) penetrating at least one of a first semiconductor substrate associated with the first semiconductor chip and a second semiconductor substrate associated with the second semiconductor chip, and the first through N-th data transmission lines include first through N-th data TSVs that penetrate at least one of the first semiconductor substrate and the second semiconductor substrate.

19. The semiconductor package of claim 18, wherein:

the second semiconductor chip is configured to directly communicate with an external device, and the first semiconductor chip is configured to communicate with the external device through the second semiconductor chip.

20. The semiconductor package of claim 17, wherein the first semiconductor chip and the second semiconductor chip are on a same plane.

* * * * *